US 6,722,942 B1

(12) United States Patent
Lansford et al.

(10) Patent No.: US 6,722,942 B1
(45) Date of Patent: Apr. 20, 2004

(54) CHEMICAL MECHANICAL POLISHING WITH ELECTROCHEMICAL CONTROL

(75) Inventors: Christopher H. Lansford, Austin, TX (US); Jeremy S. Lansford, Austin, TX (US); Bradley J. Yellitz, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 250 days.

(21) Appl. No.: 09/862,014

(22) Filed: May 21, 2001

(51) Int. Cl.[7] .............................................. B24B 1/00
(52) U.S. Cl. ........................ 451/5; 451/41; 451/36; 451/285; 204/192.25; 205/640; 205/644
(58) Field of Search ........................... 451/5, 9, 10, 11, 451/41, 285, 287, 36; 204/129.3, 129.55, 129.75, 192.25; 205/640–641, 642, 643, 644

(56) References Cited

U.S. PATENT DOCUMENTS

| | | | |
|---|---|---|---|
| 4,995,953 A | 2/1991 | Yee | 204/129.3 |
| 5,139,624 A | 8/1992 | Searson et al. | 204/129.3 |
| 5,464,509 A | 11/1995 | Micak et al. | 204/129.3 |
| 5,597,346 A | 1/1997 | Hempel, Jr. | 451/287 |
| 5,679,065 A | 10/1997 | Henderson | 451/290 |
| 5,681,215 A | 10/1997 | Sherwood et al. | 451/388 |

(List continued on next page.)

OTHER PUBLICATIONS

U.S. patent application Ser. No. 10/135,702, Lansford et al., file Apr. 30, 2002.
Cambridge University; *Activation Polarisation: The Butler–Volmer Equation*(http://www2.eng.cam.ac.uk/bt206/SOFC-Modeling/ActivationPolarisation/ Activation%20Polarisation.pdf); all; Apr. 1992.
Ecole Polytechnic Federale de Lausanne; *Steady State Voltammetry*; dfcwww.epfl.ch/le/ICP3–Lecture notes/Electrochemical Methods/Electrochemistry Course 1.pdf; all; unknown.
Karin M. Bailss et al; *Active Spatiotemporal Control of Electrochemical Reactions by Coupling to In–Plane Potential Gradients*–J. Phys. Chem. B 2001, 105; pp. 8970–8978; & Jun. 19, 2001.
Ruth Dejule; *CMP Grows in Sophistication*; Semiconductor International; http://www.semiconductor.net/semiconductor/issues/Issues/1998/nov 98/docs/feature1.asp; pp. 1–6, Nov. 1998.
Alexander E. Braun; Slurries and Pads Face 2001 Challenges: Semiconductor International; http://www.semiconductor.net/semiconductor/issues/Issues/1998/nov98/docs/feature2.asp: pp. 1–9, Nov. 1998.
Tanner McCarron; The Silver/Silver Chloride References Electrode; http://www.tannerm.com/electrochemistry/Ag ref/Ag ref.htm; pp. 1–7, 1998.

*Primary Examiner*—Eileen P. Morgan
(74) *Attorney, Agent, or Firm*—Timothy M. Honeycutt

(57) ABSTRACT

Various embodiments of a planarization device and methods of using the same are provided. In one aspect, a device for planarizing a surface of a semiconductor workpiece is provided that includes a table for holding a quantity of an electrically conducting solution thereon. A member is included for holding the semiconductor workpiece such that the surface is in contact with the solution and operates as a working electrode. The member has a first conductor for establishing electrical connection with the semiconductor workpiece. A counter electrode is provided for making electrical connection with the solution and a reference electrode is provided for making electrical connection with the solution with a known electrode potential. A power source is operable to control the electric potential between the working electrode and the counter electrode. Slurry consumption may be dramatically reduced and static etch rate due to aborts may be virtually eliminated.

31 Claims, 3 Drawing Sheets

U.S. PATENT DOCUMENTS

| | | | |
|---|---|---|---|
| 5,695,392 A | 12/1997 | Kim | 451/288 |
| 5,803,799 A | 9/1998 | Volodarsky et al. | 451/288 |
| 5,846,398 A | 12/1998 | Carpio | 205/775 |
| 5,931,725 A | 8/1999 | Inaba et al. | 451/288 |
| 5,941,758 A | 8/1999 | Mack | 451/41 |
| 6,004,193 A | 12/1999 | Nagahara et al. | 451/285 |
| 6,017,437 A | 1/2000 | Ting et al. | 205/80 |
| 6,093,089 A | 7/2000 | Chen et al. | 451/288 |
| 6,110,025 A | 8/2000 | Williams et al. | 451/286 |
| 6,116,992 A | 9/2000 | Prince | 451/286 |
| 6,171,467 B1 | 1/2001 | Weihs et al. | 205/93 |
| 6,224,472 B1 | 5/2001 | Lai et al. | 451/398 |
| 6,440,295 B1 * | 8/2002 | Wang | 205/640 |

* cited by examiner

CHEMICAL MECHANICAL POLISHING WITH ELECTROCHEMICAL CONTROL

BACKGROUND OF THE INVENTION

1. Field of the Invention

This invention relates generally to semiconductor processing, and more particularly to a chemical mechanical polishing system utilizing electrochemistry and to methods of using the same.

2. Description of the Related Art

Conventional chemical mechanical polishing ("CMP") is, as the name implies, an amalgam of chemical and mechanical processes used to planarize wafer surfaces in semiconductor fabrication. In most conventional CMP processes, a quantity of slurry is deposited on a table or platen of a CMP machine or "polisher." The table has a polish pad that is composed of a compliant or semi-compliant material that partially conforms to the varied topography of a wafer film. Thereafter, the semiconductor wafer is brought into contact with the slurry and the polish pad and relative motion is provided between the wafer and the polish pad.

Conventional slurries normally contain several components, such as one or more types of abrasive particles, a stabilizer that is designed to keep the abrasive particles from going into solution, and one or more oxidizing agents. In the CMP of various metals used in semiconductor processing, such as tungsten, the oxidizing agent of the slurry reacts with the tungsten to form a passivation layer of metal oxide. In the case of tungsten, the passivation layer consists of soft $WO_x$. The $WO_x$ prevents the transport of additional oxidizing chemicals deeper into the tungsten underlying the $WO_x$. Portions of the $WO_x$ film forming on the higher elevation areas of the tungsten film will be easily removed by the mechanical abrasive action of the abrasive particles in the slurry. As the $WO_x$ is removed, additional fresh metal is exposed which simultaneously begins to react chemically with the oxidizing agent to reform additional $WO_x$. In the lower elevation regions of the tungsten film, the $WO_x$ film forms a soft passivation layer that resists chemical etching as noted above, and because of its lower elevation, undergoes very minimal mechanical abrasion from the slurry. Eventually, the higher elevation surfaces are abraded and chemically etched down to the same level as the lower regions, and thereafter the combined passivation and abrasion processes continue to cycle until a desired polish end point is reached. The same types of chemical and mechanical mechanisms occur during CMP of the other metals, such as titanium, titanium nitride, copper, etc.

Successful CMP processing is dependent upon a number of factors, such as predictable slurry composition and predictable polish time periods. Uniform slurry composition over time ensures that wafers in a given lot and lot-to-lot are polished at the same rate. As the CMP process is consumptive of various slurry constituents, particularly the oxidizer components, it is necessary to replenish the slurry mixture frequently. Sometimes, the need for replenishment stems from the propensity for one or more of the slurry constituents to decompose over time. Hydrogen peroxide as an oxidizer is an example of such a rapidly decomposing constituent. The need for frequent replenishment, of course, increases the overall cost of the CMP process and can lead to variations in the slurry composition used for, and therefore the polish rates of, successive wafers in a given lot or for successive lots.

Predictable polish time periods again ensure that the polished film is planarized according to recipe and that process variations between successive wafers are minimal. However, conventional CMP processes sometimes do not proceed according to specified time periods. Process aborts are a leading cause of such variations. The causes for aborts are legion and include machine malfunction and slurry composition deviations to name just a few. Regardless of the exact cause, an abort usually results in the termination of the mechanical rotation of the wafer, or polish pad, depending on the tool type. During a normal CMP run, a wafer is exposed to a slurry and polished on a CMP machine for a preselected time period or until some other preselected endpoint is reached. The slurry is allowed to dwell, if at all, on the wafer surfaces for only preselected and relatively short time periods. However, during an abort, the chemical activity associated with the CMP slurry may continue, resulting in a static etch of the surfaces of the wafer exposed to the slurry. This can result in unwanted and substantial etch attack of various structures on the wafer.

Another drawback associated with the conventional slurries is the need for the inclusion of a corrosion inhibitor in order to prevent a so-called "seaming" or "coring" of tungsten lines and vias. Corrosion inhibitors add to the cost of the slurry composition.

In many cases, the chemical reactivity associated with certain slurry constituents, while desirable from a chemical mechanical polishing standpoint are nevertheless undesirable from the standpoint of the corrosion incurred by various, particularly steel, components of the CMP machine. Ammonium chloride, which is commonly used as a stabilizer, is highly corrosive to steel and thus limits the life span of exposed CMP machine steel parts. Steel corrosion can also contribute to corrosion-related particulate contamination, which has the potential to degrade product yields.

The present invention is directed to overcoming or reducing the effects of one or more of the foregoing disadvantages.

SUMMARY OF THE INVENTION

In accordance with one aspect of the present invention, a device for planarizing a surface of a semiconductor workpiece is provided that includes a table for holding a quantity of an electrically conducting solution thereon. A member is included for holding the semiconductor workpiece such that the surface is in contact with the solution and operates as a working electrode. The member has a first conductor for establishing electrical connection with the semiconductor workpiece. A counter electrode is provided for making electrical connection with the solution and a reference electrode is provided for making electrical connection with the solution with a known electrode potential. A power source is operable to control the electric potential between the working electrode and the counter electrode.

In accordance with another aspect of the present invention, a method of planarizing a surface of a semiconductor workpiece is provided that includes contacting the surface with a quantity of an abrasive slurry and applying a potential between the surface and the slurry that is at least as high as the redox potential of the surface in order to oxidize the surface. The oxidized surface is abraded by providing relative movement between the slurry and the oxidized surface.

In accordance with another aspect of the present invention, a method of planarizing a surface of a semiconductor workpiece is provided that includes applying an electrically conducting solution to a table having an abrasive surface and contacting the workpiece surface with the electrically conducting solution. A potential is applied between the workpiece surface and the electrically conducting solution that is at least as high as the redox potential of the surface in order to oxidize the surface. The oxidized surface is abraded by providing relative rubbing movement between the abrasive surface of the table and the oxidized surface.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
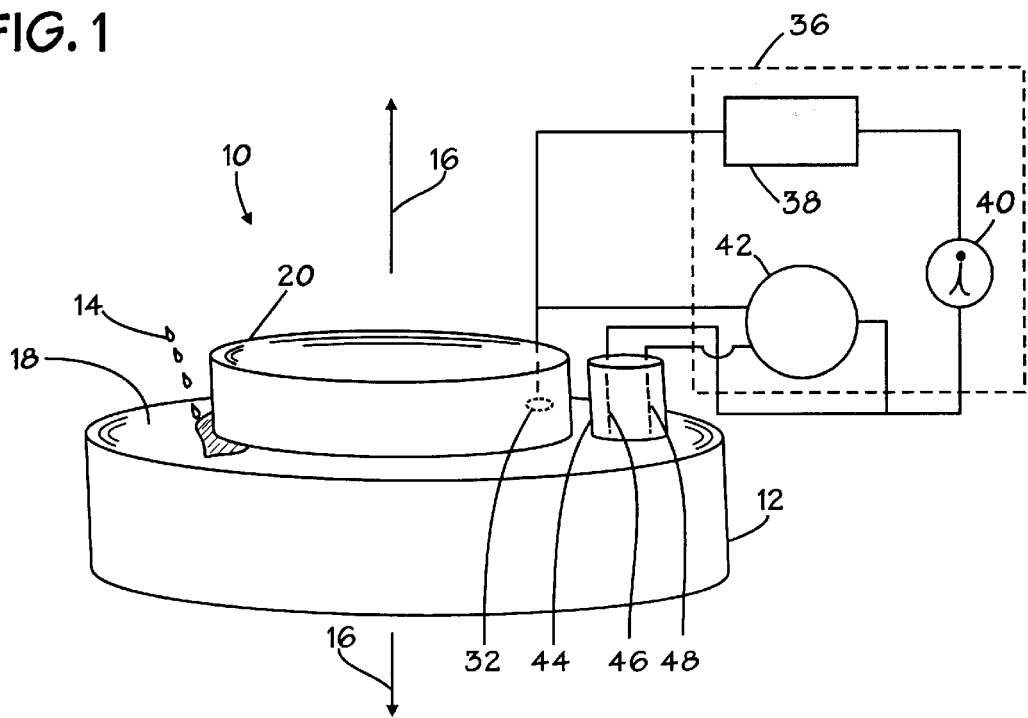
FIG. 1 is a pictorial view of an exemplary embodiment of a chemical mechanical polishing system in accordance with the present invention.

In the drawings described below, reference numerals are generally repeated where identical elements appear in more than one figure. FIG. 1 is a pictorial view of an exemplary embodiment of a chemical mechanical polishing system 10 (hereinafter CMP system 10) that utilizes electrochemistry for the oxidation aspects of CMP in accordance with the present invention. For better understanding, FIG. 1 should be viewed in conjunction with FIG. 2, which is an overhead view of the CMP system 10, and with FIG. 3, which is a cross-sectional view of FIG. 2 taken at section 3—3. The CMP system 10 includes a table 12 that is operable to receive a quantity of a electrically conducting solution 14 dispensed from a reservoir or other dispensing system (not shown). The table 12 may be motorized and therefore operable to rotate about an axis 16. An upper surface 18 of the table 12 functions as a polish pad surface and will typically be composed of a compliant material such as, for example, rubber, synthetic polymer materials, etc.

The solution or slurry 14 consists of a suspension of abrasive particles, such as, for example, alumina, silica or the like. In an exemplary embodiment, the liquid is deionized water and the abrasive is particulate alumina. As described more fully below, the oxidation aspect of the CMP process may be carried out using electrochemistry in lieu of purely chemical oxidation. Accordingly, and in contrast to conventional CMP systems, the slurry 14 need not contain an oxidizing component, although one or more may be added as desired. For example, oxidants such as potassium hydroxide, ferric nitrate or hydrogen peroxide may be added along with buffers such as ammonium persulfate, ammonium chloride or the like. As the skilled artisan will appreciate, the desired composition of an oxidant slurry will depend on the material to be polished.

Figure 3:
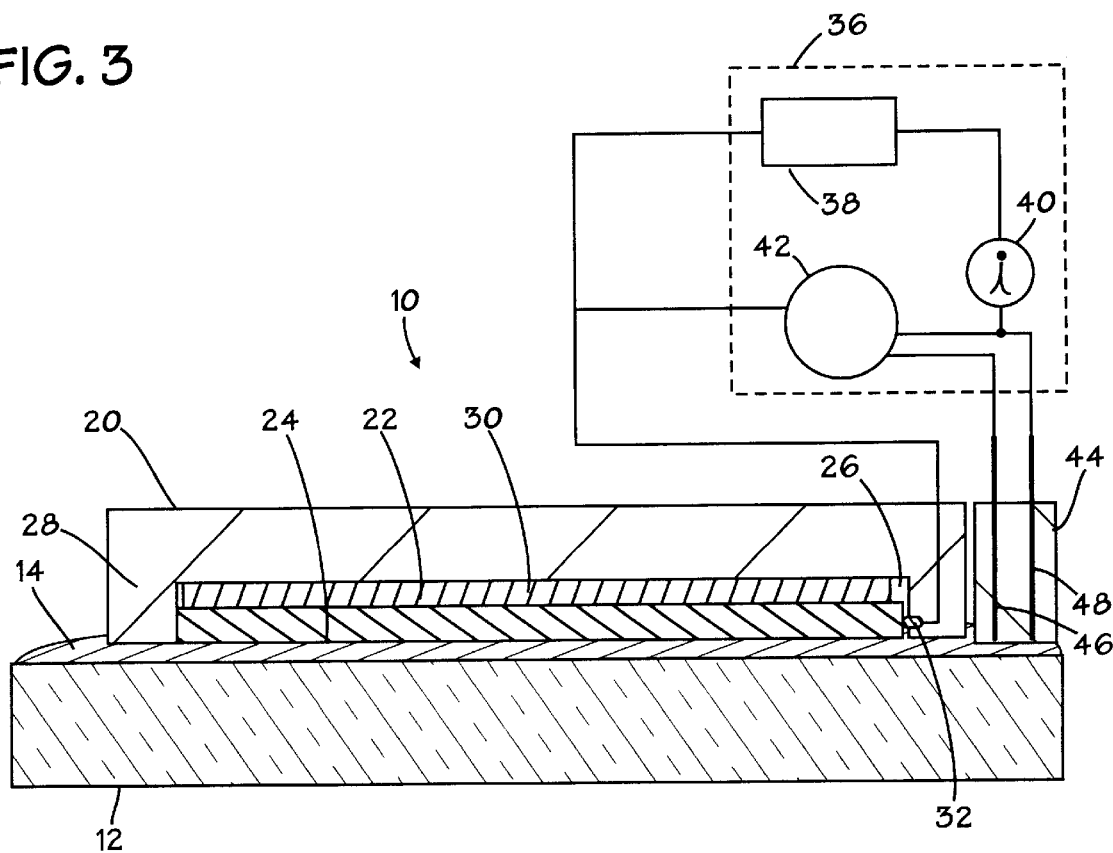
FIG. 3 is a cross-sectional view of FIG. 2 taken at section 3—3.

A member 20 is provided for holding a semiconductor wafer or workpiece 22 such that a lower surface 24 thereof is maintained in contact with the slurry 14. The member 20 is provided with a cylindrical recess 26 that defines a downwardly projecting retaining ring 28 that is large enough in internal diameter to hold the semiconductor workpiece 22 as shown in FIG. 3. A backside pad 30 is disposed between the member 20 and the semiconductor workpiece 22 as shown. The backside pad 30 is a disk-like member preferably composed of a compliant material, such as, for example, rubber, various well known synthetic rubber or polymeric materials.

In order to facilitate polishing of the workpiece 22, various types of relative movement between the member 20 and the table 12 may be provided. For example, the member 20 may be held stationary relative to the table 12 or rotated about the axis 16 in either direction, vis-a-vis, the same direction of rotation as the table 12 or the opposite direction. In addition, the member 20 may be moved in other senses relative to the table 12 as desired. For example, the member 20 may be moved across the upper surface 18 of the table 12 during rotation of either the table 12 or the member 20 or both as desired. This translation relative to the table 12 may be linear, orbiting or some other type of motion.

A conductor 32 is provided in the retaining ring 28 and has a portion thereof projecting radially inwardly into the cylindrical recess 26. The conductor 32 is designed to make compliant electrical contact with the side of the semiconductor workpiece 22. The purpose of the conductor 32 is to enable a potential to be applied to the semiconductor workpiece such that the lower surface 24 thereof functions as a working electrode during CMP processing as described more fully below. The workpiece 22 will contain sufficient impurity levels so that there will be conduction from the point of contact with the conductor 32 to the lower side 24. If desired, the conductor 32 may be positioned to contact the upper side of the workpiece 22.

An electrode housing 44 is provided for holding a counter electrode 46 and a reference electrode 48. The electrode housing 44 is advantageously composed of a electrically insulating material that prevents shorts between the counter electrode 46 and the reference electrode 48. The electrode housing 44 is positioned vertically relative to the table 12 so that the counter electrode 46 and the reference electrode 48 are maintained in physical contact with the slurry 14.

Figure 2:
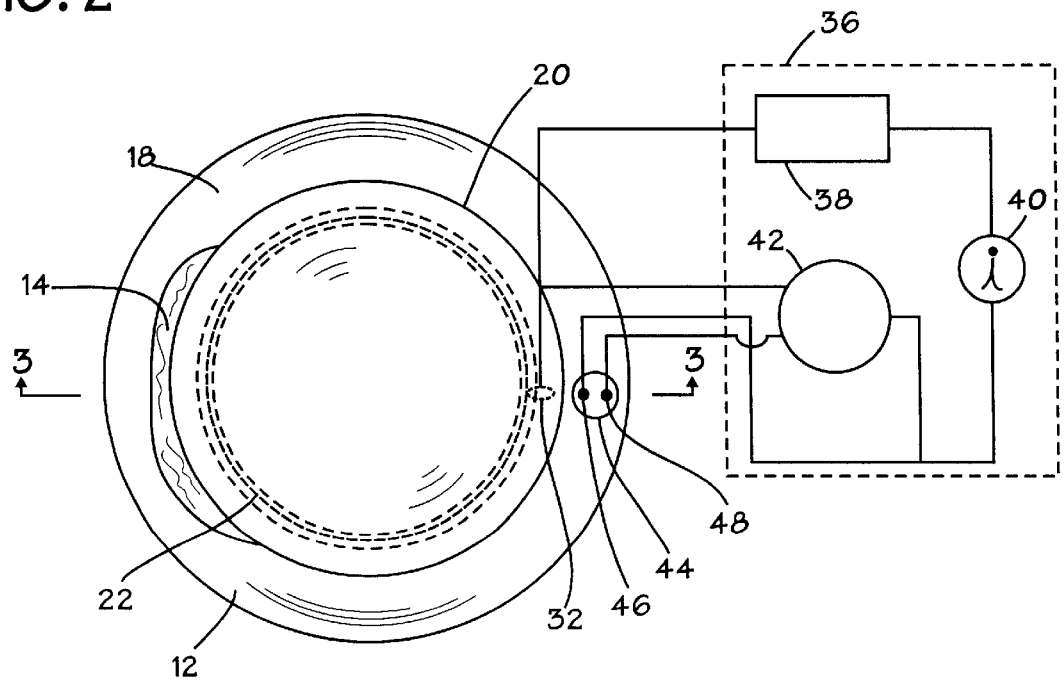
FIG. 2 is an overhead view of the chemical mechanical polishing system depicted in FIG. 1.

The counter electrode 46, the reference electrode 48 and the conductor 32 are connected to a potentiostat 36, represented schematically in FIGS. 1–3. Note that where the member 20 is configured to rotate, the electrical connection between the conductor 32 and the member 20 should be capable of accommodating rotation. The potentiostat 36 is designed to maintain a desired set potential between the conductor 32, and thus the lower surface 24 or working electrode, and the counter electrode 46 by forcing whatever current is necessary between the working electrode or lower surface 24 of the workpiece 22 and the counter electrode 46 via the slurry 14. The potentiostat 36 includes a power supply 38, a current sensor or meter 40 and a regulator 42. The regulator 42 may be an operational amplifier, an integrated circuit or other type of device. Any of a variety of commercially available potentiostats may used with the CMP system 10. Although a potentiostat lends itself readily to the task of regulating the working electrode-to-counter electrode potential, the skilled artisan will appreciate that other components will serve the function. That is, components with a power supply capable of providing a set potential between the conductor 32 and the counter electrode 46 will suffice.

In operation, the counter electrode 46 and the reference electrode 48 operate in concert with the biased lower surface 24 of the semiconductor workpiece 22 to function as a three cell electrochemical cell. That is, a controlled potential is maintained between the semiconductor workpiece 22 and the slurry 14 using the reference potential of the reference electrode 48. The potentiostat 36 is operable to maintain the potential between the workpiece 24 and the slurry 14 at a desirable set point. The desired set point will be slightly more anodic then the redox potential of the lower surface or polished surface 24 of the workpiece 22. For example, if the lower surface 24 of the workpiece 22 to be polished comprises tungsten, the redox reaction for an acidic slurry 14 is given by:

$$W + 3H_2O \rightleftharpoons WO_3 + 3H_2(g) \qquad \text{Equation 1}$$

for which the standard potential E° is 0.09 V versus the standard hydrogen electrode. Neglecting any overpotential, the oxidation potential $E_{ox}$ is given by the Nernst equation:

$$E_{ox} \approx E^0 + \frac{RT}{nF}\ln Q \qquad \text{Equation 2}$$

where where R is the universal gas constant, T is the absolute temperature, n is the charge number of the electrode reaction, F is the Faraday constant, and Q is equal to a(RED)/a(OX). The terms a(RED) and a(OX) respectively denote activities at the reduction and oxidation sides of the electrode reaction. By setting the potentiostat 36 to maintain the potential between the workpiece 24 and the slurry 14 greater than $E_{ox}$, the redox potential of tungsten, oxidation of the tungsten may be provided. In this way, the lower surface 24 of the workpiece 22 will undergo oxidation and produce an oxide film, which is then abraded away by the action of the table 12 and/or member 20 rotation and the abrasive characteristics of the slurry 14.

In another example, a copper film on the surface 24 of the workpiece 22 may be polished. The redox reactions are given by:

$$2Cu + H_2O \rightleftharpoons Cu_2O + H_2(g) \qquad \text{Equation 3}$$

for which the standard potential E° is 0.222 V versus the standard hydrogen electrode. The oxidation potential $E_{ox}$ for copper is given by substituting 0.222 V for $E_{ox}$ into Equation 2 above. A setting of greater than $E_{ox}$ on the potentiostat 36 will induce an oxidation of the copper.

Unlike conventional CMP, no chemical oxidizing agent need be present in the slurry 14 although it could be optionally added if desired. The rate of the oxidation of the lower surface 24, and therefore the polish rate, can be increased by simply applying a more anodic potential between the workpiece 22 and the slurry 14. Since the oxidation rate of the lower surface 24 is not limited by the mass transport of an oxidant molecule in the slurry 14, the maximum oxidation rate achievable using the system 10 will be greater than in conventional CMP. Furthermore, the current required to maintain the target potential at the working electrode, that is, the lower surface 24 of the workpiece 22, gives a direct measure of the amount of material that has been electrochemically oxidized, and therefore a direct measure of the polish rate, which provides real time process monitoring and end point measurement capability.

Two other significant benefits flow from the system 10. First, for certain slurry compositions, the static etch rate of the slurry could be set to zero simply by disabling the application of bias between the workpiece 22 and the slurry 14. This capability may be useful in the event of tool shut down due to mechanical failure, electrical outage or some other cause. In conventional CMP systems, tool aborts may result in a static etch rate due to overexposure to slurry which can result in excessive dishing, seam attack and other problems. Secondly, following initial CMP, the lower surface 24 of the workpiece 22 may be rinsed with electrochemical buffer and electrochemically polished by applying several seconds of rapid reduction/oxidation cycles in order to heal surface damage and clean off any residue left behind by the main CMP step. In this regard, the electrochemical buffer may consist of the slurry solution without any abrasive particles included therein. The rapid reduction/oxidation cycles may consist of a plurality of sequential reduction steps followed by oxidation. For example, assuming a copper composition for the lower surface 24, a series of copper reduction followed by copper oxidation and again reduction steps may be performed. In this way, impurities and asparities that may otherwise be present in the surface 24 may be eliminated.

Figure 4:
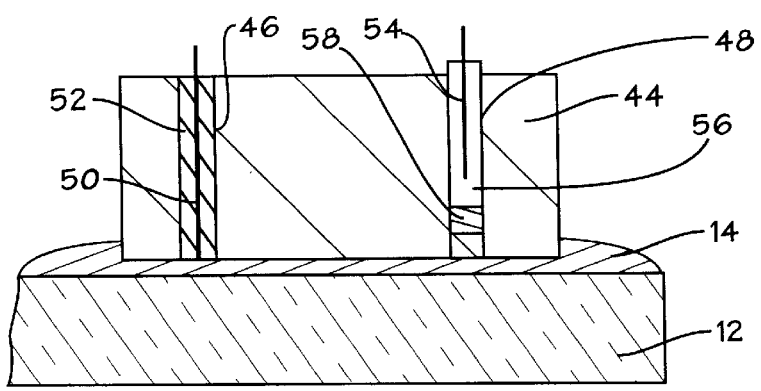
FIG. 4 is a magnified view of a portion of FIG. 3.

A more detailed view of the electrode housing 44 and the counter and reference electrodes 46 and 48 may be understood by referring now to FIG. 4, which is a magnified view of the electrode housing 44 as viewed in FIG. 3. In an exemplary embodiment, the counter electrode 46 may consist of a corrosion resistant conductor wire 50 composed of platinum, gold or the like encased within an electrically insulating sheath 52 as shown. The lower end of the electrode 50 is exposed so that it may contact the slurry 14. The reference electrode 48 may be configured as a well-known commonly used silver/silver chloride electrode. Other types of reference and quasi-reference electrodes may be used, such as a saturated calomel electrode or even a platinum wire at a floating potential. If configured as a silver/silver chloride reference electrode, a silver wire 54 is suspended in a solution 56 containing chloride, such as potassium chloride 56. A porous plug 58 is positioned at the bottom of the vessel holding the potassium chloride solution 56 to enable ionic exchange with slurry 14.

Figure 5:
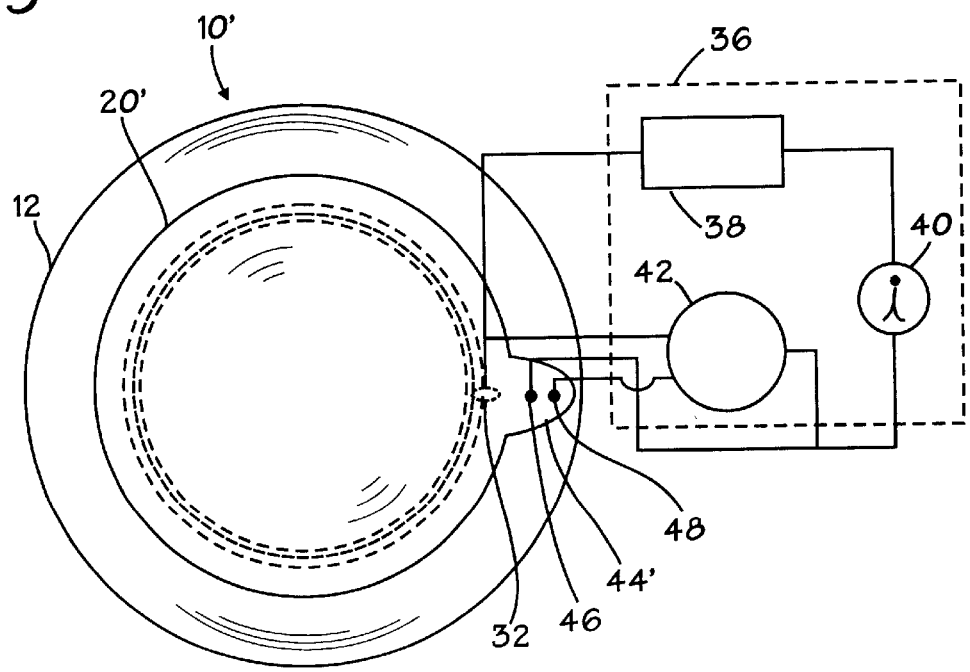
FIG. 5 is an overhead view like FIG. 2 of an alternate exemplary embodiment of a chemical mechanical polishing system in accordance with the present invention.

An alternate exemplary embodiment of the CMP system, now designated 10', may be understood by referring to FIG. 5, which is an overhead view similar to FIG. 2. In this illustrative embodiment, the electrode housing, now designated 22', is formed integrally with the member, now designated 20', as shown. This may be simply accomplished by incorporating the various openings and internal spaces for the counter and reference electrodes 46 and 48 directly into the fabrication process for the member 20. For example, if the member 20' is formed from a plastic through an injection molding process, the mold may be fashioned to incorporate the shape and size of the electrode housing 44 directly into the outer periphery of the member 20' as shown. In other aspects, the CMP system 10' may be configured and function as described above with regard to the other embodiments. Note that if it is intended to enable rotation of the member 20', connections between the conductor 32, the counter electrode 46 and the reference electrode 48 and the components of the potentiostat 36 will need to accommodate rotation of the member 20'.

Figure 6:
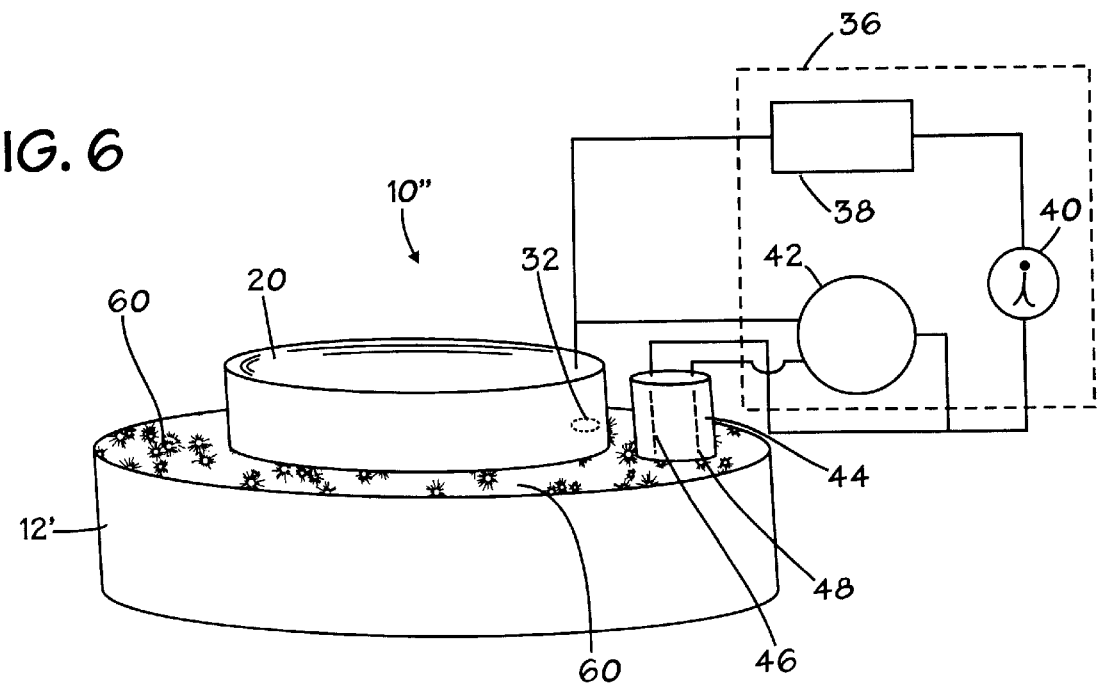
FIG. 6 is an overhead view like FIG. 2 of another alternate exemplary embodiment of a chemical mechanical polishing system in accordance with the present invention.

Another alternate embodiment of the CMP system, now designated 10", may be understood by referring to FIG. 6. In this illustrative embodiment, the upper surface 18 of the table, now designated 12', is provided with a quantity of abrasive particles 60. The abrasive particles 60 may be affixed to the surface 18 by an adhesive, as part of an abrasive roll or tape, or by direct incorporation into the surface 18 itself. For example, if the surface 18 is composed of a molded rubber or plastic material, the abrasive 60 may be incorporated into the molding process. This configuration provides for a slurry-less CMP. A suitable conducting solution will still be needed to achieve the desired oxidation through electrochemical interactions. In other aspects, the CMP system 10" may be configured and function as described above with regard to the other embodiments. An electrode housing 44 may be provided with a counter electrode 46 and a reference electrode 48 connected to the components of the potentiostat 36. Note that if it is intended to enable rotation of the member 20, connections between the conductor 32, the counter electrode 46 and the reference electrode 48 and the components of the potentiostat 36 will need to accommodate rotation of the member 20.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A device for planarizing a surface of a semiconductor workpiece, comprising:
    a table for holding a quantity of an electrically conducting solution thereon;
    a member for holding the semiconductor workpiece such that the surface is in contact with the solution and operates as a working electrode, the member having a first conductor for establishing electrical connection with the semiconductor workpiece;
    a counter electrode for making electrical connection with the solution;
    a reference electrode for making electrical connection with the solution with a known electrode potential; and
    a power source operable to control the electric potential between the working electrode and the counter electrode.

2. The device of claim 1, wherein the solution comprises an abrasive slurry.

3. The device of claim 1, wherein the table comprises an abrasive surface for abrading the surface of the semiconductor workpiece.

4. The device of claim 1, wherein the member comprises a retaining ring.

5. The device of claim 1, wherein the first conductor comprises a metallic member operable to maintain compliant contact with the semiconductor workpiece.

6. The device of claim 1, wherein the counter electrode comprises a platinum wire.

7. The device of claim 1, wherein the reference electrode comprises a Ag/AgCl reference electrode.

8. The device of claim 1, wherein the reference electrode comprises a quasi-reference electrode at a floating potential.

9. The device of claim 8, wherein the quasi-reference electrode comprises a platinum wire.

10. The device of claim 1, wherein the reference electrode and the counter electrode are coupled to the member.

11. The device of claim 1, wherein the table is operable to rotate.

12. The device of claim 1, wherein the member is operable to rotate the semiconductor workpiece.

13. The device of claim 11, wherein the member is operable to rotate the semiconductor workpiece.

14. A method of planarizing a surface of a semiconductor workpiece, comprising:
    contacting the surface with a quantity of an abrasive slurry;
    applying a potential between the surface and the slurry that is at least as high as the redox potential of the surface in order to oxidize the surface; and
    abrading the oxidized surface by providing relative movement between the slurry and the oxidized surface.

15. The method of claim 14, wherein the abrasive slurry comprises alumina particulates.

16. The method of claim 14, comprising monitoring the potential applied between the surface and the slurry by measuring a potential difference between the slurry and a reference electrode in contact with the slurry.

17. The method of claim 14, wherein the step of applying the potential between the surface and the slurry comprising connecting a power supply to the semiconductor workpiece and to a counter electrode, and connecting the counter electrode to the slurry so that current flows from the surface to the counter electrode.

18. The method of claim 14, wherein the surface comprises tungsten.

19. The method of claim 14, wherein the surface comprises copper.

20. The method of claim 14, wherein the relative movement between the slurry and the oxidized surface is provided by rotating the semiconductor workpiece.

21. The method of claim 14, wherein the relative movement between the slurry and the oxidized surface is provided by applying the slurry to a table and rotating the table relative to the semiconductor workpiece.

22. The method of claim 20, wherein the relative movement between the slurry and the oxidized surface is provided by applying the slurry to a table and rotating the table relative to the semiconductor workpiece.

23. A method of planarizing a surface of a semiconductor workpiece comprising:
    applying an electrically conducting solution to a table having an abrasive surface;
    contacting the workpiece surface with the electrically conducting solution;
    applying a potential between the workpiece surface and the electrically conducting solution that is at least as high as the redox potential of the surface in order to oxidize the surface; and
    abrading the oxidized surface by providing relative rubbing movement between the abrasive surface of the table and the oxidized surface.

24. The method of claim 23, wherein the electrically conducting solution comprises water.

25. The method of claim 23, comprising monitoring the potential applied between the workpiece surface and the electrically conducting solution by measuring a potential difference between the electrically conducting solution and a reference electrode in contact with the electrically conducting solution.

26. The method of claim 23, wherein the step of applying the potential between the workpiece surface and the electrically conducting solution comprising connecting a power supply to the semiconductor workpiece and to a counter electrode, and connecting the counter electrode to the electrically conducting solution so that current flows from the workpiece surface to the counter electrode.

27. The method of claim 23, wherein the workpiece surface comprises tungsten.

28. The method of claim 23, wherein the workpiece surface comprises copper.

29. The method of claim 23, wherein the relative movement between the electrically conducting solution and the oxidized surface is provided by rotating the semiconductor workpiece.

30. The method of claim 23, wherein the relative movement between the electrically conducting solution and the oxidized surface is provided by rotating the table relative to the semiconductor workpiece.

31. The method of claim 29, wherein the relative movement between the electrically conducting solution and the oxidized surface is provided by rotating the table relative to the semiconductor workpiece.

* * * * *